(12) United States Patent
Lim

(10) Patent No.: US 9,718,679 B2
(45) Date of Patent: Aug. 1, 2017

(54) INTEGRATED HEATER FOR GETTERING OR OUTGASSING ACTIVATION

(71) Applicant: InvenSense, Inc., San Jose, CA (US)

(72) Inventor: Martin Lim, San Mateo, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/598,138

(22) Filed: Jan. 15, 2015

(65) Prior Publication Data
US 2015/0158720 A1   Jun. 11, 2015

Related U.S. Application Data

(63) Continuation-in-part of application No. 13/535,180, filed on Jun. 27, 2012.
(Continued)

(51) Int. Cl.
*H01L 23/02* (2006.01)
*H01L 21/54* (2006.01)
(Continued)

(52) U.S. Cl.
CPC ............ *B81C 1/00285* (2013.01); *B81B 7/02* (2013.01); *B81B 2201/0235* (2013.01); *B81B 2201/0242* (2013.01)

(58) Field of Classification Search
CPC .......... H01L 21/6835; H01L 21/76802; H01L 23/481; H01L 24/02; H01L 25/0657;
(Continued)

(56) References Cited

U.S. PATENT DOCUMENTS

| 5,285,131 A | 2/1994 | Muller et al. |
| 5,493,177 A | 2/1996 | Muller et al. |

(Continued)

FOREIGN PATENT DOCUMENTS

| CN | 101898746 | 12/2010 |
| CN | 103183308 | 7/2013 |

(Continued)

OTHER PUBLICATIONS

European Search Report dated Mar. 8, 2016 for European Application Serial No. 15188710.6, 8 pages.
(Continued)

*Primary Examiner* — David Vu
*Assistant Examiner* — Mouloucoulaye Inoussa
(74) *Attorney, Agent, or Firm* — Amin, Turocy & Watson, LLP

(57) ABSTRACT

A Microelectromechanical Systems (MEMS) structure with integrated heater is disclosed. The MEMS structure with integrated heater comprises a first substrate with cavities, bonded to a second substrate, forming a plurality of sealed enclosures of at least two types. Each of the plurality of sealed enclosures is defined by the first substrate, the second substrate, and a seal-ring material, where the first enclosure type further includes at least one of a gettering element to decrease cavity pressure in the first enclosure type or an outgassing element to increase cavity pressure in the first enclosure type when activated. The first enclosure type further comprises at least one heater integrated into the first substrate adjacent to the gettering element or the outgassing element to adjust the temperature of the gettering element or the outgassing element thereby providing heating to the gettering element or the outgassing element.

10 Claims, 7 Drawing Sheets

Related U.S. Application Data

(60) Provisional application No. 61/501,652, filed on Jun. 27, 2011.

(51) Int. Cl.
  *H01L 21/04* (2006.01)
  *B81C 1/00* (2006.01)
  *B81B 7/02* (2006.01)

(58) Field of Classification Search
  CPC ............... H01L 25/50; H01L 21/76898; H01L 21/823475; H01L 21/823481; H01L 21/12
  USPC .......... 257/15, 414, 416, 417, E23.193, 723, 257/E23.18, E21.501; 438/48–52, 438/455–459, 476
  See application file for complete search history.

(56) References Cited

U.S. PATENT DOCUMENTS

| | | | |
|---|---|---|---|
| 5,531,121 A | 7/1996 | Sparks et al. | |
| 6,936,491 B2 | 8/2005 | Partridge et al. | |
| 7,008,812 B1 | 3/2006 | Carley | |
| 7,075,160 B2 | 7/2006 | Partridge et al. | |
| 7,104,129 B2 | 9/2006 | Nasiri et al. | |
| 7,442,570 B2 | 10/2008 | Nasiri et al. | |
| 8,328,966 B1 | 12/2012 | Laib et al. | |
| 9,067,779 B1 | 6/2015 | Rothenberg | |
| 2003/0231967 A1 | 12/2003 | Najafi et al. | |
| 2004/0077117 A1 | 4/2004 | Ding | |
| 2004/0166385 A1* | 8/2004 | Morse | H01M 8/04216 429/421 |
| 2006/0208326 A1 | 9/2006 | Nasiri et al. | |
| 2009/0294879 A1 | 12/2009 | Bhagavat et al. | |
| 2010/0025845 A1* | 2/2010 | Merz | B81B 7/0038 257/723 |
| 2011/0079425 A1 | 4/2011 | Baillin et al. | |
| 2011/0121412 A1* | 5/2011 | Quevy | B81B 7/02 257/415 |
| 2012/0043627 A1 | 2/2012 | Lin et al. | |
| 2012/0279302 A1 | 11/2012 | Lim et al. | |
| 2012/0326248 A1 | 12/2012 | Daneman et al. | |
| 2014/0225206 A1 | 8/2014 | Lin et al. | |
| 2015/0129991 A1 | 5/2015 | Lee et al. | |

FOREIGN PATENT DOCUMENTS

| | | |
|---|---|---|
| CN | 103253625 | 8/2013 |
| DE | 102012202183 A1 | 8/2013 |
| TW | I396659 | 5/2013 |

OTHER PUBLICATIONS

Office Action dated May 6, 2016 for U.S. Appl. No. 13/535,180, 25 pages.
Office Action dated Dec. 23, 2013 for U.S. Appl. No. 13/535,180, 19 pages.
Office Action dated Oct. 7, 2014 for U.S. Appl. No. 13/535,180, 21 pages.
Office Action dated Mar. 27, 2015 for U.S. Appl. No. 13/535,180, 21 pages.
Office Action dated Oct. 7, 2015 for U.S. Appl. No. 13/535,180, 22 pages.
Office Action dated Apr. 10, 2014 for U.S. Appl. No. 13/535,180, 31 pages.
Office Action dated Feb. 26, 2016 for U.S. Appl. No. 14/603,185, 27 pages.
Office Action dated Sep. 22, 2016 for U.S. Appl. No. 14/603,185, 32 pages.
Chinese Office Action dated Sep. 23, 2016 for Chinese Application Serial No. 201510646926.2, 7 pages.
Taiwan Office Action dated Mar. 14, 2017 for Taiwan Application No. 104132144, 6 pages (with translation).

* cited by examiner

INTEGRATED HEATER FOR GETTERING OR OUTGASSING ACTIVATION

CROSS-REFERENCE TO RELATED APPLICATION

This application is a continuation-in-part of U.S. patent application Ser. No. 13/535,180, filed on Jun. 27, 2012, entitled "METHODS FOR CMOS-MEMS INTEGRATED DEVICES WITH MULTIPLE SEALED CAVITIES MAINTAINED AT VARIOUS PRESSURES," which claims the benefit of U.S. Provisional Patent Application No. 61/501,652, filed on Jun. 27, 2011, entitled "MEMS DEVICES, INTEGRATED MEMS CMOS," all of which are incorporated herein by reference in their entireties.

FIELD OF THE INVENTION

The present invention relates generally to MEMS (Microelectromechanical systems) devices and more particularly relates to MEMS devices containing hermetically sealed enclosures at different pressures.

BACKGROUND OF THE INVENTION

MEMS technology has advanced to provide integrated packaging of different MEMS devices or sensors on a single chip. Although such integration offers significant advantages such as reduced requirements for commodity of space or "real estate", it is often desirable to have different devices and sensors sealed at different pressures or different gas compositions when integrating multiple MEMS devices on the same chip. It will be recognized by those skilled in the art that such a need may arise where, for instance, different devices are sought to be optimized for different pressures or where different devices may require different ambient gasses or pressures (hereby referred to as ambient or ambients) to operate. For example, two hermetically sealed enclosures one containing a gyroscope and another containing an accelerometer would require different pressures, since a gyroscope requires a much lower pressure (vacuum) and accelerometer requires a pressure higher than that required for gyroscope for optimal performance.

It is often desirable to have different devices sealed at different pressures involving minimal processing steps, achieving a more predictable outcome through improved control, and having reduced requirements for the commodity of space or "real estate". Therefore, it is desired to have a system and method that provides for two or more cavities with different pressures or different ambient gasses for operation on the same chip.

One approach to establish multiple pressures during the wafer bonding involves a method where a material is included in one of the enclosures that can absorb (getter) or desorb (outgas) gas molecules which can affect the pressure. In the case where the material has absorptive properties (getter) the pressure would decrease and in the case of desorptive properties (outgas) the pressure will increase. To achieve lower pressure, one of the enclosures may contain a gettering element that at elevated temperature absorbs at least one of the gasses present in the enclosure to decrease enclosure pressure. Similarly, to achieve higher pressure, one of the enclosures controls an outgassing source that, at elevated temperature, desorbs a controlled amount of one or more gases thereby increasing the enclosure pressure.

However, depending on the material of the getter and the outgasser and the gas absorbed, as in the case of gettering, or released, as in the case of outgassing, the gettering or outgassing material may require higher temperature for activation and/or acceleration of the absorption or desorption process. Therefore, there is a need to provide heating to the gettering or the outgassing material enclosed in the hermetically sealed chambers. Further what is needed is a system and method providing for the integration of such heaters into integrated CMOS-MEMS to create multi-ambient devices.

SUMMARY OF THE INVENTION

A Microelectromechanical Systems (MEMS) structure with integrated heater is disclosed. The MEMS structure with integrated heater comprises a first substrate with cavities, bonded to a second substrate, forming a plurality of sealed enclosures of at least two types. Each of the plurality of sealed enclosures is defined by the first substrate, the second substrate, and a seal-ring material, where the first enclosure type further includes at least one of a gettering element to decrease cavity pressure in the first enclosure type and an outgassing element to increase cavity pressure in the first enclosure type, and where the first enclosure type further comprises at least one heater integrated into the first substrate adjacent to the gettering element or the outgassing element. The integrated heater is activated to adjust the temperature of the gettering element or the outgassing element thereby providing Joule heating to the gettering element or the outgassing element.

A Microelectromechanical Systems (MEMS) structure with integrated heater is disclosed. The MEMS structure with integrated heater comprises a first substrate with cavities, bonded to a second substrate, forming a plurality of sealed enclosures of at least two types. Each of the plurality of sealed enclosures is defined by the first substrate, the second substrate, and a seal-ring material, where the first enclosure type further includes at least one of a gettering element to decrease cavity pressure in the first enclosure type or an outgassing element to increase cavity pressure in the first enclosure type, and where the first enclosure type further comprises at least one heater integrated into the first substrate adjacent to the gettering element or the outgassing element. The integrated heater is activated to adjust the temperature of the gettering element or the outgassing element thereby providing Joule heating to the gettering element or the outgassing element.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENTS

Figure 1:
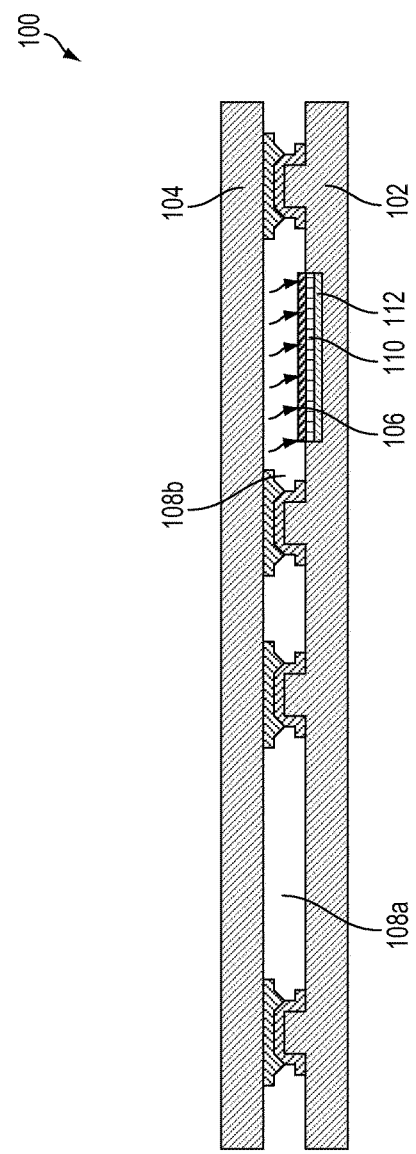
FIG. 1 illustrates a first MEMS structure containing two sealed enclosures Enclosure 1 and Enclosure 2.

The present invention relates generally to the fabrication of MEMS devices, and more particularly to providing for different pressures for two or more cavities containing different MEMS devices requiring different pressures for operation, on the same chip. The method and system in accordance with the present invention provides for different pressures for two or more cavities containing MEMS devices requiring different pressures for operation, on the same chip that require different operating pressures or ambient gasses in operation. For example, MEMS resonators which typically require a low and stable pressure may be integrated with inertial sensors such as accelerometers or gyroscopes which require a higher pressure to operate.

The present invention provides a method and system for creating multiple pressure levels in multiple sealed cavities fabricated on a chip. The method and system allow for depositing a gettering or outgassing material within the cavities that absorb or desorb gasses at elevated temperatures and providing an integrated heater to activate the gettering or outgassing material deposited within the sealed cavities. The method in accordance with the present invention, in one or more embodiments, also provides for integrating a heating element in the second sealed enclosure containing a gettering or an outgassing material alongside the main sealed enclosure. Below are provided a variety of approaches available in accordance with the present invention, in one or more embodiments, providing for the integration of such heating elements into integrated CMOS-MEMS to create multi-ambient or multi-pressure devices. In the described embodiments, the CMOS wafer may be replaced by any suitable capping wafer or substrate.

For each of the approaches, it will be appreciated that a MEMS structure comprises a MEMS wafer. The MEMS wafer may include a handle wafer with cavities bonded to a device wafer through a dielectric layer disposed between the handle and device wafers. The bonding of the device wafer and subsequent thinning of the device wafer produces an intermediate stage of the process referred to as an Engineered Silicon on Insulator wafer where cavities in the handle wafer are sealed by a layer of the device wafer. The MEMS wafer may also include a moveable portion of the device wafer suspended over a cavity in the handle wafer. The MEMS wafer further includes standoffs that are defined by selectively removing areas of the device wafer to product protrusions or standoffs of the device layer. A germanium material is then disposed over these standoffs and will be used for a CMOS wafer to adhere to the MEMS wafer through aluminum to germanium bonding. Prior to bonding the MEMS wafer may also include a moveable portion of the device wafer suspended over a cavity in the handle wafer. These portions are typically defined by a lithographic masking and etch steps.

The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, a method and system in accordance with the present invention is not intended to be limited to the embodiment shown but is to be accorded the widest scope consistent with the principles and features described herein.

A method and system in accordance with the present invention provides a series of approaches for producing two or more cavities with different pressures or ambient on the same chip using gettering and outgassing elements. In the case where the material has absorptive properties (getter) the pressure would decrease and in the case of desorptive properties (outgas) the pressure will increase. To achieve lower pressure, one of the enclosures may contain a gettering element that at elevated temperature absorbs at least one of the gasses present in the enclosure to decrease enclosure pressure. Similarly, to achieve higher pressure, one of the enclosures controls an outgassing source that, at elevated temperature, desorbs a controlled amount of one or more gases thereby increasing the enclosure pressure. However, depending on the material of the getter and the outgasser and the gas absorbed, as in the case of gettering, or released, as in the case of outgassing, the gettering or outgassing material may require higher temperature for activation and/or acceleration of the absorption or desorption process.

This is achieved by providing an integrated heater to heat the gettering or the outgassing material enclosed in the hermetically sealed chambers. A system and method in accordance with the present invention allows for quickly changing the temperature of a fabricated apparatus comprising a MEMS substrate, and/or a CMOS die to avoid inefficient external heating. By integrating a heater into the MEMS substrate adjacent to the gettering or the outgassing material and controlling a current through the integrated heater by an external source or by the CMOS die, Joule heating causes the temperature of the heater to increase thereby increasing the temperature of the gettering or the outgassing material resulting in the activation of the gettering or the outgassing material. Ideal gettering or outgassing material would have an activation temperature at or above 450° C. which is above bonding temperature used for fabrication of MEMS devices.

Furthermore, it is desirable to have an outgassing material where additional gases can be preferentially dissolved which then can be released when placed within the hermetically enclosed chamber as this specially engineered outgassing material is heated leading to more efficient outgassing. Similarly, it is desirable to have a gettering material where the trapped gases can be preferentially removed which then can absorb more gas when placed within the hermetically enclosed chamber as this specially engineered gettering material is heated leading to more efficient gettering.

The heating can be achieved by using electronic circuit comprising resistor resulting in Joule heating as described below, or by using radiation such as IR, Laser etc., along with other conventional heating techniques. Focus laser and IR energy is possible due to the property of silicon to transmit higher wavelengths associated with IR energy. Due to the high thermal conductivity of the silicon of the MEMS and CMOS die and their small masses, the time constant or the time to heat up the masses is very small thereby enabling rapid heating of the gettering or the outgassing material.

In one embodiment in accordance with the present invention, the heater is integrated into the MEMS substrate and the gettering material preferably depleted of the gas to be absorbed or the outgassing material saturated with the gas to be desorbed is applied adjacent to the heater. The material for instance can be deployed on top of an intermediate layer, for example a silicon layer, which may be disposed on top of the heater element. The heater is activated by applying a current through two terminals of the heater and the intermediate layer isolates the gettering or outgassing material from direct contact to the heater element. Once the heater is activated, the temperature of the heater is increased due to Joule heating which in turn increases the temperature of the gettering or the outgassing material. The high thermal conductivity of the silicon components of the system and the small masses involved in the system results in a time constant that is very small including but not limited to the order of milliseconds. Accordingly, the gettering or the outgassing material is rapidly heated by the heater.

In one embodiment, the heater is a resistive heater with terminals connected to either the CMOS die or directly to package pads. A CMOS integrated heater can be formed by semiconductor compatible materials like polysilicon and thermal isolation can be achieved by micromachining material beneath the heating element. Alternatively in another embodiment, the two terminal heater is integrated with the MEMS substrate to allow current to pass across the two terminals to increase the temperature.

By running a current through the heater, the heater is activated to control the temperature of the gettering or the outgassing material. For a simple outgassing operation to increase pressure, the activation can be part of a test sequence. For pressure optimization, a close loop control system can be used to activate the pressure modifying material and use a pressure sensing method like amplitude monitoring or Q monitoring to provide feedback to an integrated control circuit to tune the pressure. The activation of the heater is controlled by the CMOS die. In one embodiment, the CMOS die includes a temperature sensor, an electronic circuit for measuring the temperature sensor's output signals, an electronic circuit for measuring the MEMS sensor's output signals, and an electronic circuit for energizing and/or activating the heater. In one embodiment, the on chip temperature sensor measures the temperature of the gettering or the outgassing material. In another embodiment, an external thermocouple that is in contact with the outer package measures the temperature of the gettering or the outgassing material.

One of ordinary skill in the art readily recognizes that the MEMS/CMOS die can include a variety of different types of electronic circuit components and that would be within the spirit and scope of the present invention. In another embodiment, the activation of the heater is controlled by an external source. There are different ways to integrate the resistive heater into the MEMS/CMOS die including but not limited to micromachining and screen printing methodologies. In one embodiment, the resistive heater is a film deposited into a top surface of the MEMS/CMOS die. In this embodiment, the resistive heater is any material that conducts or semiconducts current including but not limited to polysilicon, various metals, various metallic silicides, and other silicon based films, and resistive patches. In another embodiment, the resistive heater is a high resistance material including but not limited to a polymer with metal dust.

Another embodiment illustrates a system for controlling temperature of a MEMS sensor. The system includes a CMOS die, a silicon MEMS substrate coupled to the CMOS die, a film heater integrated into the silicon MEMS substrate, a first wire bond coupled to a first terminal of the film hearer, and a second wire bond coupled to a second terminal of the film heater.

In one embodiment, the film heater is deposited into a top surface of the silicon MEMS substrate. In this embodiment, the film heater is split into two discontinuous pieces by a cut of varying degree including but not limited to a shallow cut and a deep cut. The cut provides a discontinuity in the film. The current path is then subject to pass through a portion of the silicon MEMS substrate in the region of the area of discontinuity. The resistance between the first and second heater terminals is determined by the doping level of the silicon MEMS substrate. In one embodiment, the film heater is deposited after implantation of the silicon MEMS substrate to get good contact between the deposited film heater and the silicon MEMS substrate.

One of ordinary skill in the art readily recognizes that between the first and second heater terminals, a variety of resistances and voltage differences can be utilized to determine the amount of power generated for heating of the film heater and that would be within the spirit and scope of the present invention. Additionally, one of ordinary skill in the art readily recognizes that a variety of outer package masses and heating times can be utilized and that would be within the spirit and scope of the present invention.

In one embodiment, a resistance of 200 ohms and a 2 volt (V) voltage difference between the first and second heater terminals is assumed. Combining the equations Power (P)=Current (I)×Voltage (V) and I=V/Resistance (R), results in P=V2/R or 16.2 milli Watt of power being generated for the heating of polysilicon film heater. Additionally, in this embodiment, we assume that the heater is a suspended bridge supporting material that is 100×500×10 µm is dimension with a density similar to silicon of 2300 kg/m$^3$ and. The corresponding mass is roughly 1.15 microgram. Assuming a heat capacity similar to silicon of 712 Joules/kg/° C. respectively and to achieve a temperature increase of 425° C. in order to reach 450° C., the heater will be activated for 16 milliseconds.

As above described, the system and method allow for rapidly increasing controlling of the gettering and the degassing material in wafer scale packaged MEMS sensors to more efficiently and more accurately modify pressure as required by the MEMS components such as gyroscopes and accelerometers, enclosed in hermetically sealed chambers on a single chip, for their optimal performance. By integrating a heater into the MEMS substrate of the wafer scale packaged MEMS sensor, temperature rises can be achieved in approximately one second without the usage of complicated equipment. In comparison, conventional methods typically require approximately 20-30 seconds for the temperature rises and use complicated equipment such as well isolated ovens and/or contact heaters.

As illustrated in the following description of figures, in an embodiment, a substance that either outgases or absorbs (getters) gas at high temperature along with an integrated heater is included in one or more of the enclosures. The substance for instance can be deployed on top of an intermediate layer, for example a silicon layer, which may be disposed on top of the integrated heater element. The heater is activated by applying a current through two terminals of the heater and the intermediate layer isolates the gettering or outgassing material from direct contact to the heater element. The two wafers are then sealed using any valid high-temperature approach including solder reflow, glass frit, anodic bonding, or epoxy bonding. At the elevated temperature the included substance will either outgas, thereby creating a higher pressure in its enclosure, or serve as a getter thereby creating a lower pressure in its enclosure.

FIG. 1 illustrates a MEMS structure 100 containing two sealed enclosures Enclosure 1 108a and Enclosure 2 108b; where Enclosure 2 108b contains a gettering element 106 provided with an integrated heating element 112 that at elevated temperature absorbs at least one of the gasses present in the enclosure to decrease enclosure pressure. An intermediate layer 110 is disposed on top of the heating element 112 to separate the gettering element 106 from the heating element 112. In the case of MEMS side heater, the heating element 112 can be a device layer or an alternate resistive heating material. Alternatively, the gettering element 106 can be deployed on either MEMS side 104 or CMOS side 102 and hence the heating element 112 can also be on either side to provide heating to the respective gettering element. In the case of CMOS side heater the heating element 112 can be a polysilicon resistor a metal.

Figure 2:
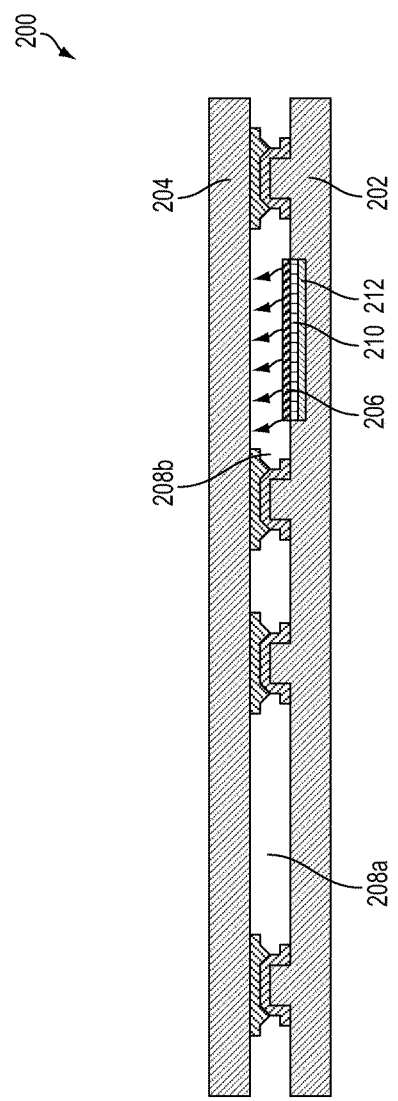
FIG. 2 illustrates a second MEMS structure containing two sealed enclosures Enclosure 1 and Enclosure 2.

FIG. 2 illustrates a MEMS structure 200 containing two sealed enclosures Enclosure 1 208a and Enclosure 2 208b; where Enclosure 2 208b contains an outgassing element 206 provided with an integrated heating element 212 that at elevated temperature desorbs a controlled amount of one or more gases thereby increasing the enclosure pressure. An intermediate layer 210 is disposed on top of the heating element 212 to separate the outgassing element 206 from the heating element 212. In the case of MEMS heater, the heating element 212 can be a device layer or an alternate resistive heating material. Alternatively, the outgassing element 206 can be deployed on either MEMS side 204 or CMOS side 202 and hence the heating element 212 can also be on either side to provide heating to the respective outgassing element. In the case of CMOS heater the heating element 212 can be a polysilicon resistor a metal.

Figure 3:
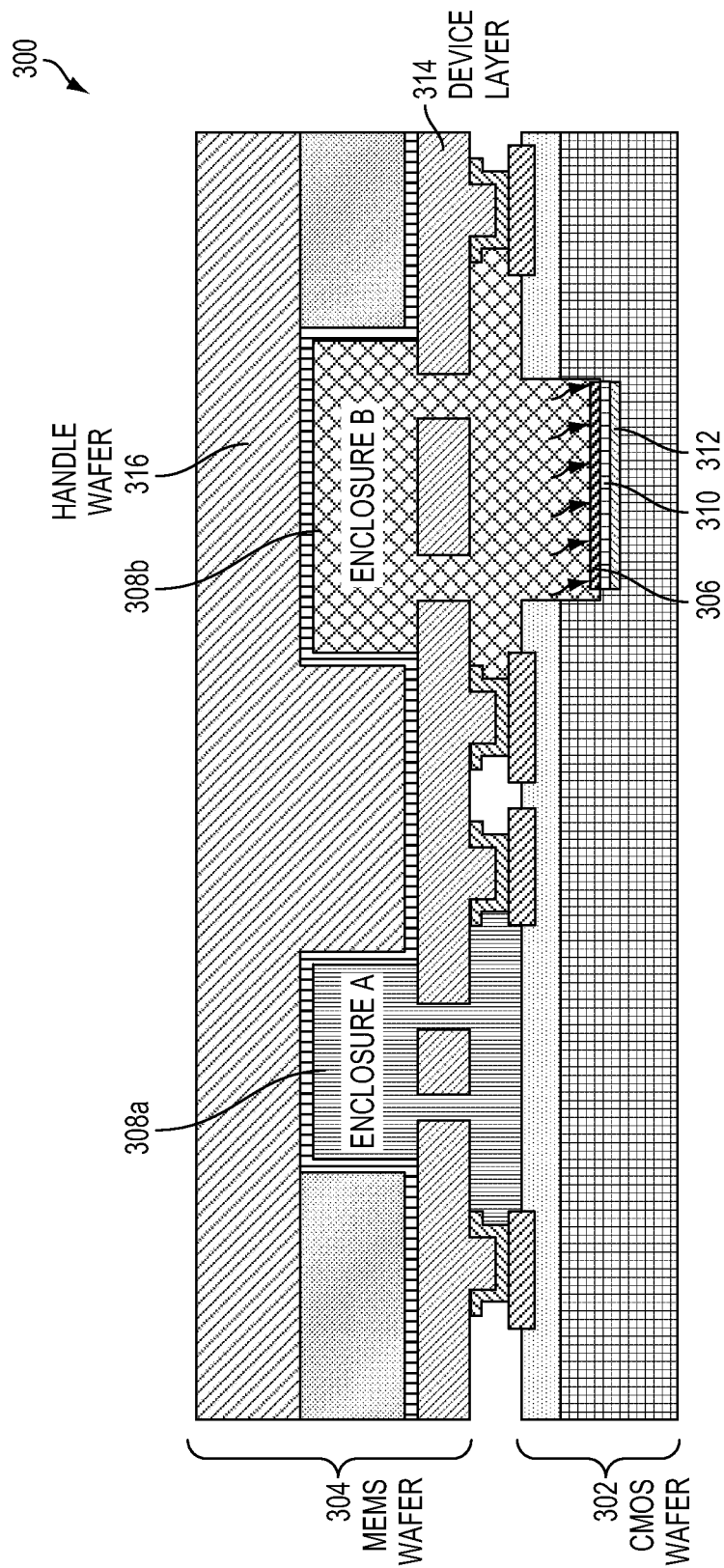
FIG. 3 illustrates a first MEMS structure formed by bonding a MEMS wafer to a CMOS wafer; with Enclosure A and Enclosure B.

FIG. 3 illustrates a MEMS structure 300 formed by bonding a MEMS wafer 304 to a CMOS wafer 302; with Enclosure A 308a and Enclosure B 308b; where Enclosure B 308b contains a gettering element 306 provided with an integrated heating element 312 on the CMOS wafer 302 that at elevated temperature absorbs at least one of the gasses present in the enclosure to decrease enclosure pressure. This is achieved by removing the silicon beneath the wafer. An intermediate layer 310 is disposed on top of the heating element 312 to separate the gettering element 306 from the heating element 312. In this case the heating element can be a polysilicon resistor or a metal.

Figure 4:
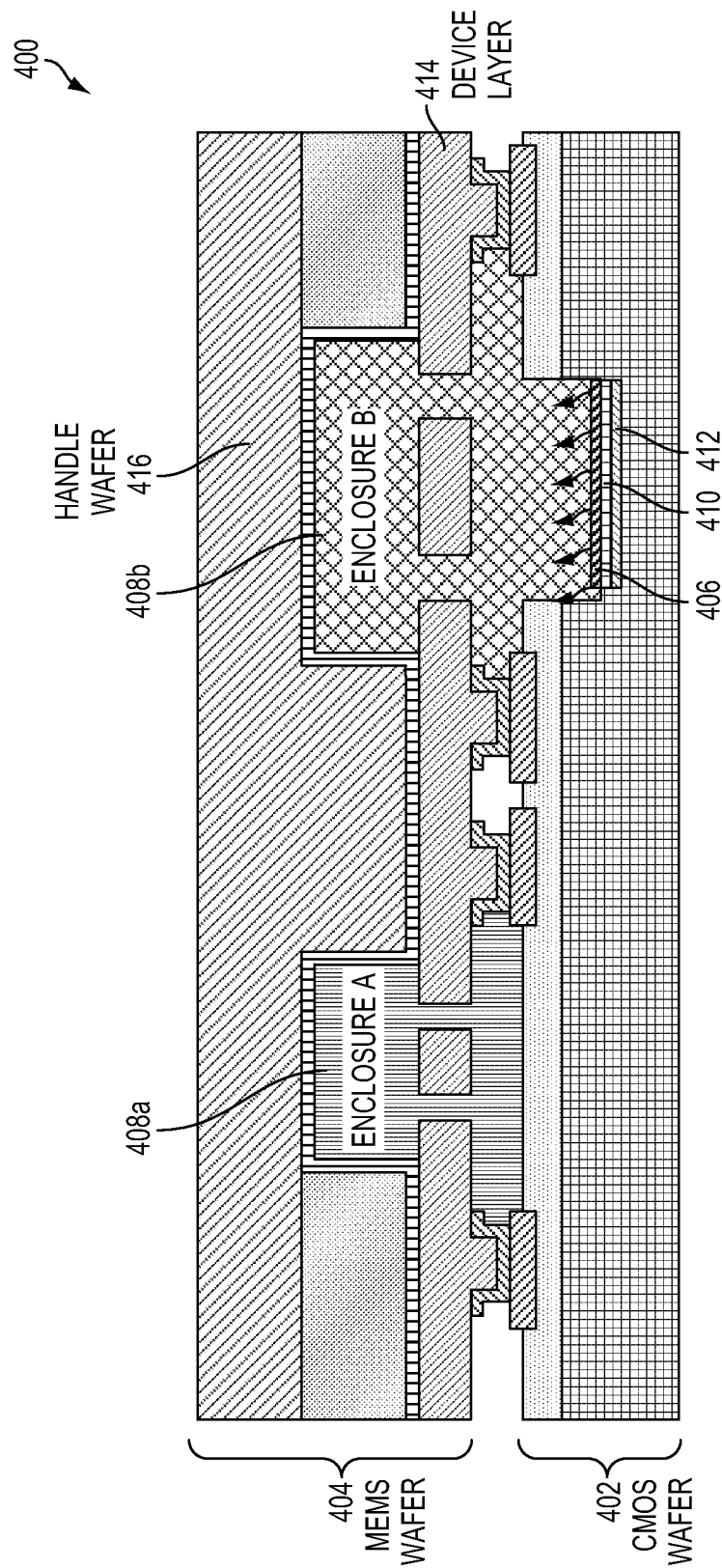
FIG. 4 illustrates a second MEMS structure formed by bonding a MEMS wafer to a CMOS wafer; with Enclosure A and Enclosure B.

FIG. 4 illustrates a MEMS structure 400 formed by bonding a MEMS wafer 404 to a CMOS wafer 402; with Enclosure A 408a and Enclosure B 408b; where Enclosure B 408b contains an outgassing element 406 provided with an integrated heating element 112 on the CMOS wafer 402 that at elevated temperature desorbs a controlled amount of one or more gases thereby increasing the enclosure pressure. This is achieved by removing the silicon beneath the wafer. An intermediate layer 410 is disposed on top of the heating element 412 to separate the outgassing element 406 from the heating element 412. In this case the heating element 412 can be a polysilicon resistor or a metal.

Figure 5:
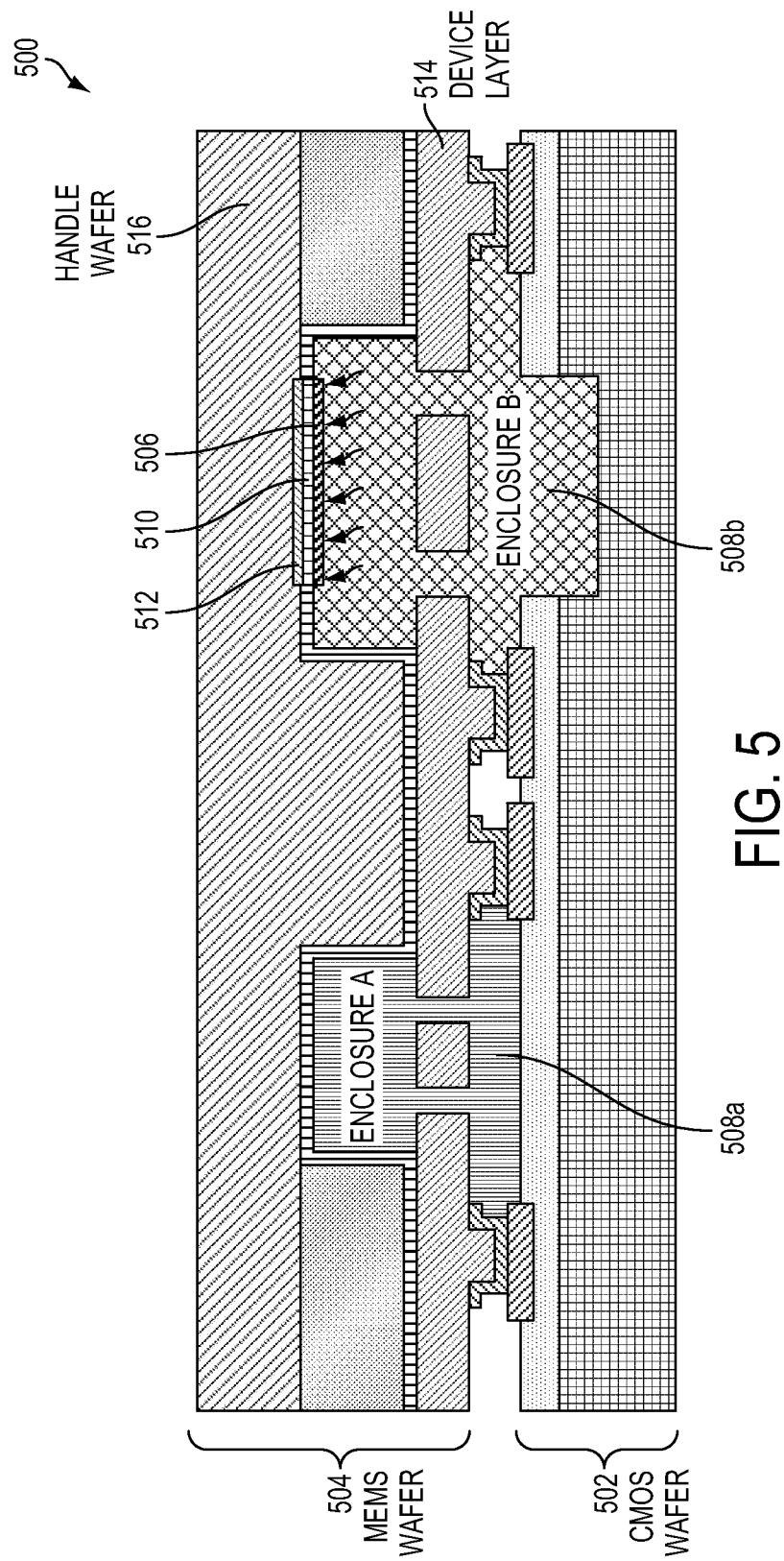
FIG. 5 illustrates a third MEMS structure formed by bonding a MEMS wafer to a CMOS wafer; with Enclosure A and Enclosure B.

FIG. 5 illustrates a MEMS structure 500 formed by bonding a MEMS wafer 504 to a CMOS wafer 502; with Enclosure A 508a and Enclosure B 508b. The MEMS wafer further comprises a handle wafer 516 and a device layer 514. The Enclosure B 508b contains a gettering element 506 provided with an integrated heating element 512 on the handle wafer 516 that at elevated temperature absorbs at least one of the gasses present in the enclosure to decrease enclosure pressure. An intermediate layer 510 is disposed on top of the heating element 512 to separate the gettering element 506 from the heating element 512. In this case, the heating element 512 can be a device layer or an alternate resistive heating material. Alternatively, when the gettering element 506 is deposited on the handle wafer 516, the heating can also be provided by the laser ablation rather than conventional resistive heater.

Figure 6:
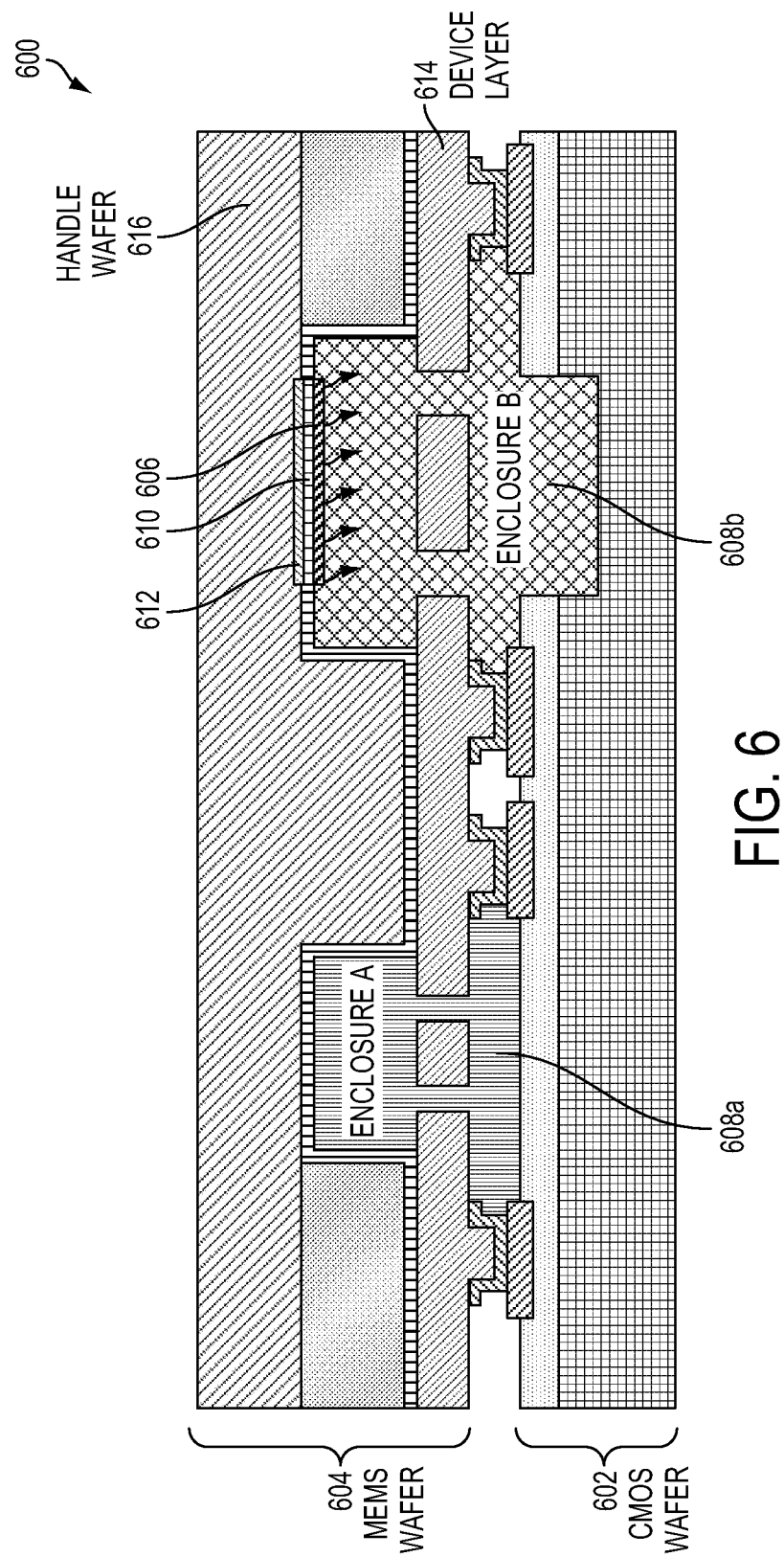
FIG. 6 illustrates a fourth MEMS structure formed by bonding a MEMS wafer to a CMOS wafer; with Enclosure A and Enclosure B.

FIG. 6 illustrates a MEMS structure 600 formed by bonding a MEMS wafer 604 to a CMOS wafer 602; with Enclosure A 608a and Enclosure B 608b. The MEMS wafer 604 further comprises a handle wafer 616 and a device layer 614. The Enclosure B 608b contains an outgassing element 606 provided with an integrated heating element 612 on the handle wafer 616 that at elevated temperature at elevated temperature desorbs a controlled amount of one or more gases thereby increasing the enclosure pressure. An intermediate layer 610 is disposed on top of the heating element 612 to separate the outgassing element 606 from the heating element 612. In this case, the heating element 612 can be a device layer or an alternate resistive heating material. Alternatively, when the outgassing element 606 is deposited on the handle wafer 616, the heating can also be provided by the laser ablation rather than conventional resistive heater.

Figure 7:
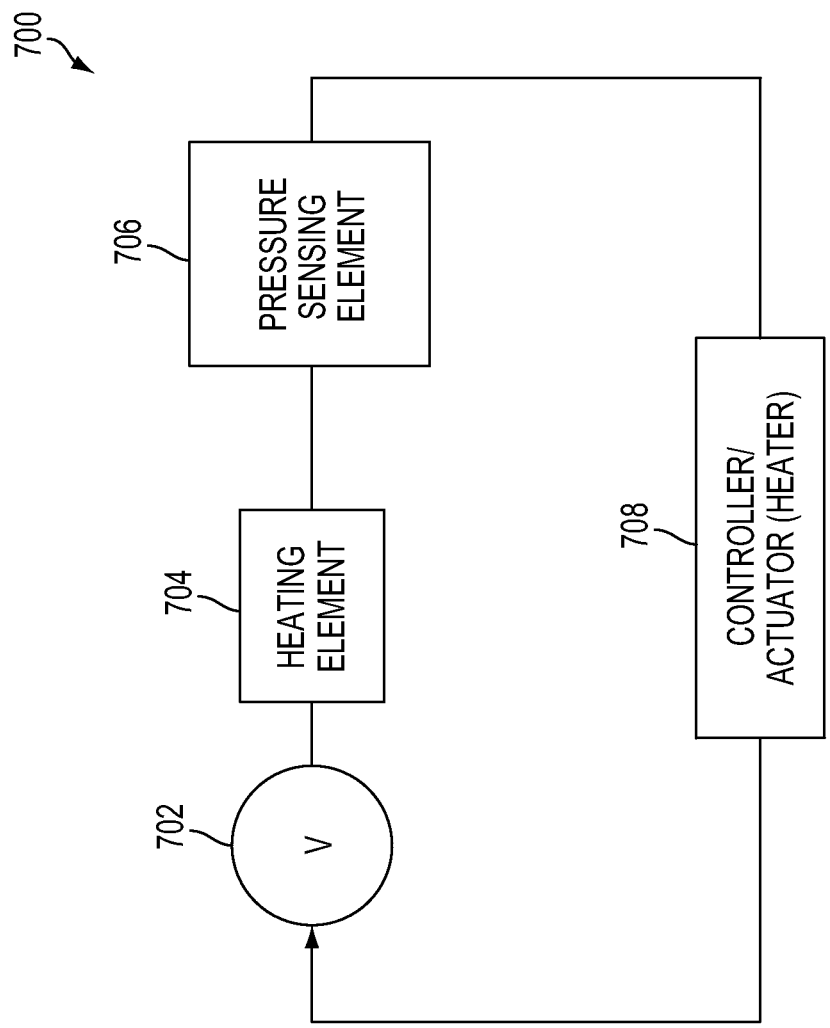
FIG. 7 illustrates an integrated heater provided with a heating element, a pressure sensing element and an actuator to control voltage provided to the heating element.

FIG. 7 illustrates a closed loop integrated heating system 700 provided with a voltage supplier, a heating element 704, a pressure sensing element 706 and an actuator 708 to control voltage provided to the heating element. The pressure sensing element 706 measures some parameter that is pressure sensitive, for example, displacement of the resonator (amplitude), Q of the device or a direct pressure measurement. The pressure sensing element 706 acts as a transducer which generates a signal as a function of the pressure imposed. In an embodiment such a signal is an electrical signal. The actuator 708 takes the input from the pressure sensing element 706 and feeds it back to the voltage supplier 702, which then increases or decreases the voltage supplied to the heating element 704 thereby controlling heating and hence pressure.

Although the present invention has been described in accordance with the embodiments shown, one of ordinary skill in the art will readily recognize that there could be variations to the embodiments and those variations would be within the spirit and scope of the present invention, such as the inclusion of circuits, electronic devices, control systems, and other electronic and processing equipment. Accordingly, many modifications may be made by one of ordinary skill in the art without departing from the spirit and scope of the appended claims. Many other embodiments of the present invention are also envisioned.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the word preferable, preferably or preferred in the description above indicates that the feature so described may be more desirable, it nonetheless may not be necessary and embodiments lacking the same may be contemplated as within the scope of the invention, that scope being defined by the claims that follow.

What is claimed is:

1. A microelectromechanical systems (MEMS) structure comprising:
   a first substrate with cavities, bonded to a second substrate, that forms a plurality of hermetically sealed enclosures of at least two types comprising at least a first hermetically sealed enclosure and a second hermetically sealed enclosure, wherein each of the plurality of hermetically sealed enclosures is defined by the first substrate, the second substrate, and a seal-ring material, wherein a first enclosure type of the first hermetically sealed enclosure or the second hermetically sealed enclosure further includes a gettering element configured to decrease cavity pressure in the first enclosure type or an outgassing element configured to increase cavity pressure in the first enclosure type, and wherein the first enclosure type further includes at least one heater integrated into the second substrate adjacent to the gettering element or the outgassing element configured to adjust the temperature of the gettering element or the outgassing element and configured to adjust a gas composition by temperature specific selective absorption or desorption of the gettering element or the outgassing element, respectively, in the first enclosure type of the first hermetically sealed enclosure or the second hermetically sealed enclosure.

2. The MEMS structure of claim 1, wherein the first substrate is a MEMS substrate.

3. The MEMS structure of claim 2, wherein the second substrate comprises a CMOS substrate.

4. The MEMS structure of claim 1; wherein the first substrate is a CMOS substrate.

5. The MEMS structure of claim 1, wherein the second substrate comprises a MEMS substrate.

6. The MEMS structure of claim 1, wherein the first hermetically sealed enclosure and the second hermetically sealed enclosure are at different pressures.

7. The MEMS structure of claim 1, wherein the first hermetically sealed enclosure and the second hermetically sealed enclosure contain different gas compositions.

8. The MEMS structure of claim 1, wherein the seal-ring material is comprised of at least one of a reflowed solder, a glass frit, an anodic bond, or an epoxy bond.

9. A Microelectromechanical Systems (MEMS) structure comprising:
   a MEMS substrate with cavities bonded to a second substrate, that form a plurality of hermetically sealed enclosures of at least two types,
   wherein each of the plurality of hermetically sealed enclosures is defined by the MEMS substrate, the second substrate, and a seal-ring material, and
   wherein a first enclosure type of the plurality of hermetically sealed enclosures of at least two types further includes an integrated heater of a complementary metal-oxide semiconductor (CMOS) substrate configured to adjust pressure in the first enclosure type by adjusting gas composition by temperature specific selective absorption or desorption of a gettering element configured to decrease cavity pressure in the first enclosure type or an outgassing element configured to increase cavity pressure in the first enclosure type, respectively.

10. The MEMS structure of claim 9, wherein the second substrate comprises a CMOS substrate.

* * * * *